United States Patent
Carcia et al.

(10) Patent No.: US 7,067,843 B2
(45) Date of Patent: Jun. 27, 2006

(54) TRANSPARENT OXIDE SEMICONDUCTOR THIN FILM TRANSISTORS

(75) Inventors: Peter Francis Carcia, Wilmington, DE (US); Robert Scott McLean, Hockessin, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 103 days.

(21) Appl. No.: 10/669,940

(22) Filed: Sep. 24, 2003

(65) Prior Publication Data

US 2004/0127038 A1    Jul. 1, 2004

Related U.S. Application Data

(60) Provisional application No. 60/417,767, filed on Oct. 11, 2002.

(51) Int. Cl.
    *H01L 29/04*    (2006.01)
(52) U.S. Cl. ........................................................ 257/59
(58) Field of Classification Search .................. 257/59
    See application file for complete search history.

(56) References Cited

U.S. PATENT DOCUMENTS

| | | | |
|---|---|---|---|
| 4,204,217 A | | 5/1980 | Goodman |
| 5,864,149 A | * | 1/1999 | Yamamori .................. 257/59 |
| 5,942,756 A | * | 8/1999 | Tran ....................... 250/370.09 |
| 6,087,205 A | * | 7/2000 | Yamamori ................... 438/158 |
| 6,420,032 B1 | * | 7/2002 | Iacovangelo ................. 428/412 |
| 6,773,941 B1 | * | 8/2004 | French et al. ................. 438/29 |
| 6,850,005 B1 | * | 2/2005 | Yoneda et al. .............. 313/506 |
| 2002/0056838 A1 | | 5/2002 | Ogawa |
| 2004/0085279 A1 | * | 5/2004 | Kim et al. .................... 345/92 |

FOREIGN PATENT DOCUMENTS

JP    2002-76356    3/2002

OTHER PUBLICATIONS

Fortunato, Elvira, Materials Research Society Symposium Proceedings, vol. 666, 2001, pp. F3.21, F5.2, F11.3 Materials Research Society, Portugal.
C.H. Seager, et al., "Charge trapping and device behavior in ferroelectric memories", Appl. Phys. Lett. 68, May 6, 1996, pp. 2660-2662, vol. 19, American Institute of Physics, Albuquerque, New Mexico.
S. Giancaterina, et al., "Elaboration and adhesion of zinc oxide coatings on poly-ether-ether-ketone films", Surface and Coatings Technology, (2001) pp. 84-94, France.

(Continued)

*Primary Examiner*—Thao P. Le

(57) ABSTRACT

Transistors fabricated with transparent oxide semiconductors are provided. The semiconductors are metal oxides deposited without the intentional incorporation of additional doping elements, and enable the fabrication of transparent thin film transistors. The transparent transistors can be used to control pixels in a display, without significantly reducing the active area of the pixels.

11 Claims, 13 Drawing Sheets

OTHER PUBLICATIONS

S Maniv, et al., "Transparent condicting zinc oxide and indium-tin oxide films prepared by modified reactive planar magnetron sputtering", J. Vac. Sci. Technol. A 1 (3), American Vacuum Society, (1983), pp. 1360-1375, Canada.

Yutaka Ohya, et al., "Thin Film Transistor of ZnO Fabricated by Chemical Solution Deposition", J. Appl. Phys. vol. 40 (2001) pp. 297-298, Japan.

Ohtomo, et al., "Novel Semiconductor Technologies of ZnO Films Towards Ultraviolet LEDs and Invisible FETs", IEICE Trans. Electron., (2000), pp. 1614-1617, vol. E83-C, No. 10.

Maniv, et al., "Transparent conducting zinc oxide", J.Vac. Sci. Technol. A., (1983), vol. 1, No. 3.

Haartsen, et al., "The Junction Fet Used as a Saw Detector in Zn)-SiO$_2$-Si Structures", Ultrasonics Symposium, (1989), pp. 207-211, The Netherlands.

Ohya, et al., "Thin Film Transistor of ZnO Fabricated by Chemical Solution Deposition", J. Appl. Phys., (2001), pp. 297-298, vol. 40, Japan.

S. Giancaterina, et al., "Elavoration and adhesion of zinc oxide coatings on poly-ether-ether-ketone films", Surface and Coatings Technology, Elsevier Science, (2001), vol. 138, France.

Fortunato, et al., "Characterization of Zinc Oxide Thin Films Deposited by rf Magnetron Sputtering on Mylar Substrates", Mat. Res. Soc. Symp. Proc. (2001), vol. 666.

* cited by examiner

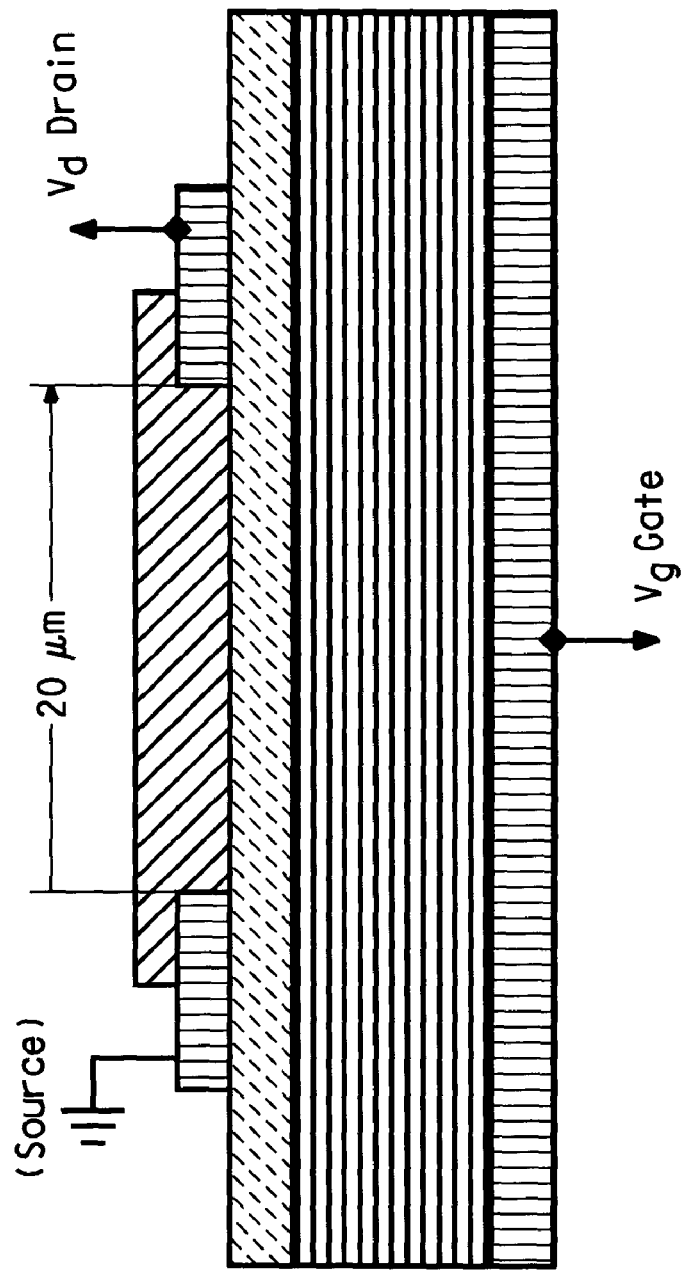
FIG. 3
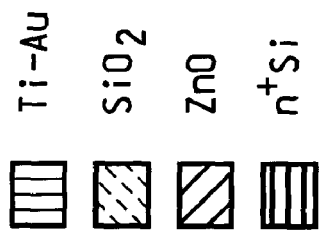

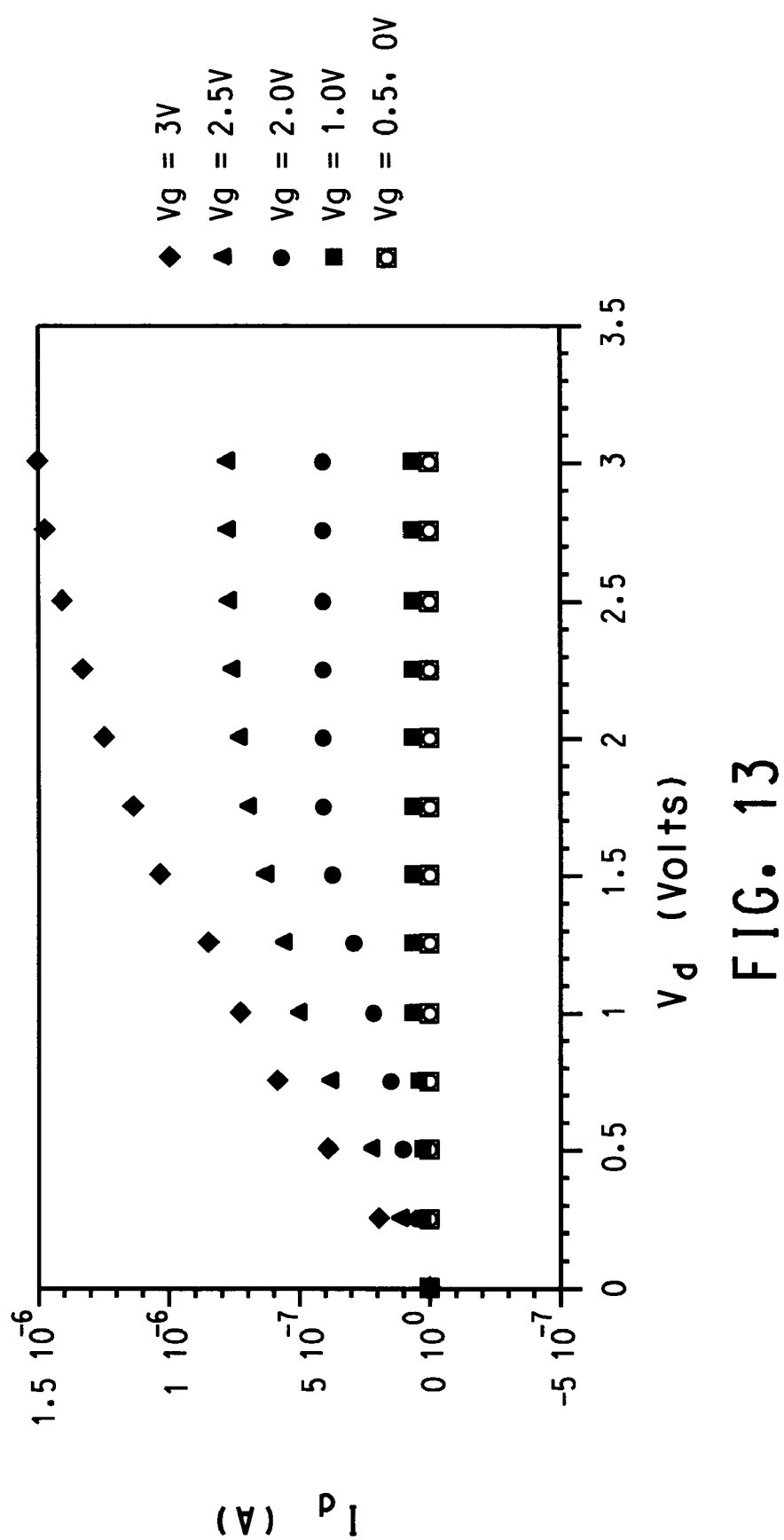

TRANSPARENT OXIDE SEMICONDUCTOR THIN FILM TRANSISTORS

FIELD OF THE INVENTION

The present invention relates to a transistor fabricated with a transparent oxide semiconductor selected from the group consisting of zinc oxide, indium oxide, tin oxide, and cadmium oxide deposited without the intentional incorporation of additional doping elements and the process for deposition of the oxide semiconductors. Transparent oxide semiconductors are useful in fabrication of transparent thin film transistors. Transparent transistors can be used to control pixels in a display. By being transparent, the transistor may not significantly reduce the active area of the pixel.

TECHNICAL BACKGROUND

Fortunato et al (Materials Research Society Symposium Proceedings (2001) 666) described zinc oxide films containing aluminum deposited on polyester by radio-frequency magnetron sputtering.

Japanese Patent Application 2002076356 A describes a channel layer made of zinc oxide and doped with transition metals.

Goodman (U.S. Pat. No. 4,204,217 A) discloses a liquid crystal transistor.

Ohya et al (Japanese Journal of Applied Physics, Part 1 (January 2001) vol 40, no.1, p297–8 disclose a thin film transistor of ZnO fabricated by chemical solution deposition.

Maniv et al (J. Vac. Sci Technol., A (1983), 1(3), 1370–5 describe conducting zinc oxide films prepared by modified reactive planar magnetron sputtering.

Giancaterina et al (Surface and Coatings Technology (2001) 138(1), 84–94 describe zinc oxide coatings deposited by radio frequency magnetron sputtering.

Seager et al. (Appl. Phys. Lett. 68, 2660–2662, 1996) describe using the electric field emanating from a ferroelectric insulator to control or modulate resistance in a conducting film of ZnO:Al or ZnO:In.

Transparent conducting oxides are reviewed in the August, 2000 isuue of the Materials Research Bulletin, Volume 25 (8) 2000, devoted to materials and properties of transparent conducting oxide compounds.

SUMMARY OF THE INVENTION

This invention relates to novel, transparent oxide semiconductor (TOS) thin film transistors (TFT's) and the process for their deposition, where the transparent oxide semiconductor (TOS) is selected from the group consisting of zinc oxide (ZnO), indium oxide ($In_2O_3$), tin oxide ($SnO_2$), or cadmium oxide (CdO) semiconductor and combinations thereof. The TFT structure described includes the TOS with conducting electrodes, commonly referred to as a source and a drain, for injecting a current into the TOS and a capacitance charge injection scheme for controlling and/or modulating the source-drain current. The semiconductor deposition process uses magnetron sputtering of an oxide (ZnO, $In_2O_3$, $SnO_2$, CdO) or metal (Zn, In, Sn, Cd) target in an atmosphere with a controlled partial pressure of oxygen in an inert gas. This is a low temperature process which is compatible with temperature sensitive substrates and components. One particularly attractive application of TOS TFT's is in the drive circuits for displays on flexible, polymer substrates.

The process specifically involves depositing an undoped transparent oxide semiconductor in a field effect transistor, comprising a method selected from the group consisting of:
  a) physical vapor deposition of undoped TOS in an effective partial pressure of oxygen mixed with an inert gas;
  b) resistive evaporation of undoped TOS in an effective partial pressure of oxygen;
  c) laser evaporation of undoped-TOS in an effective partial pressure of oxygen;
  d) electron beam evaporation of undoped TOS in an effective partial pressure of oxygen; and
  e) chemical vapor deposition of undoped TOS in an effective partial pressure of oxygen.

The invention also concerns a transistor comprising with an undoped transparent oxide semiconductor. In one embodiment the transister is on a flexible substrate and further comprises a gate dielectric fabricated from a material selected from the group consisting of zinc oxide, indium oxide, tin oxide, and cadmium oxide.

BRIEF DESCRIPTION OF THE DRAWINGS

FIG. 3 shows the ZnO TFT test configuration.

FIG. 13 shows a graph of transistor current ($I_d$) versus drain voltage ($V_d$) curves for gate voltages between zero and three (3) volts and $V_d$ between 0 and 3 V.

DETAILED DESCRIPTION

Figure 1:
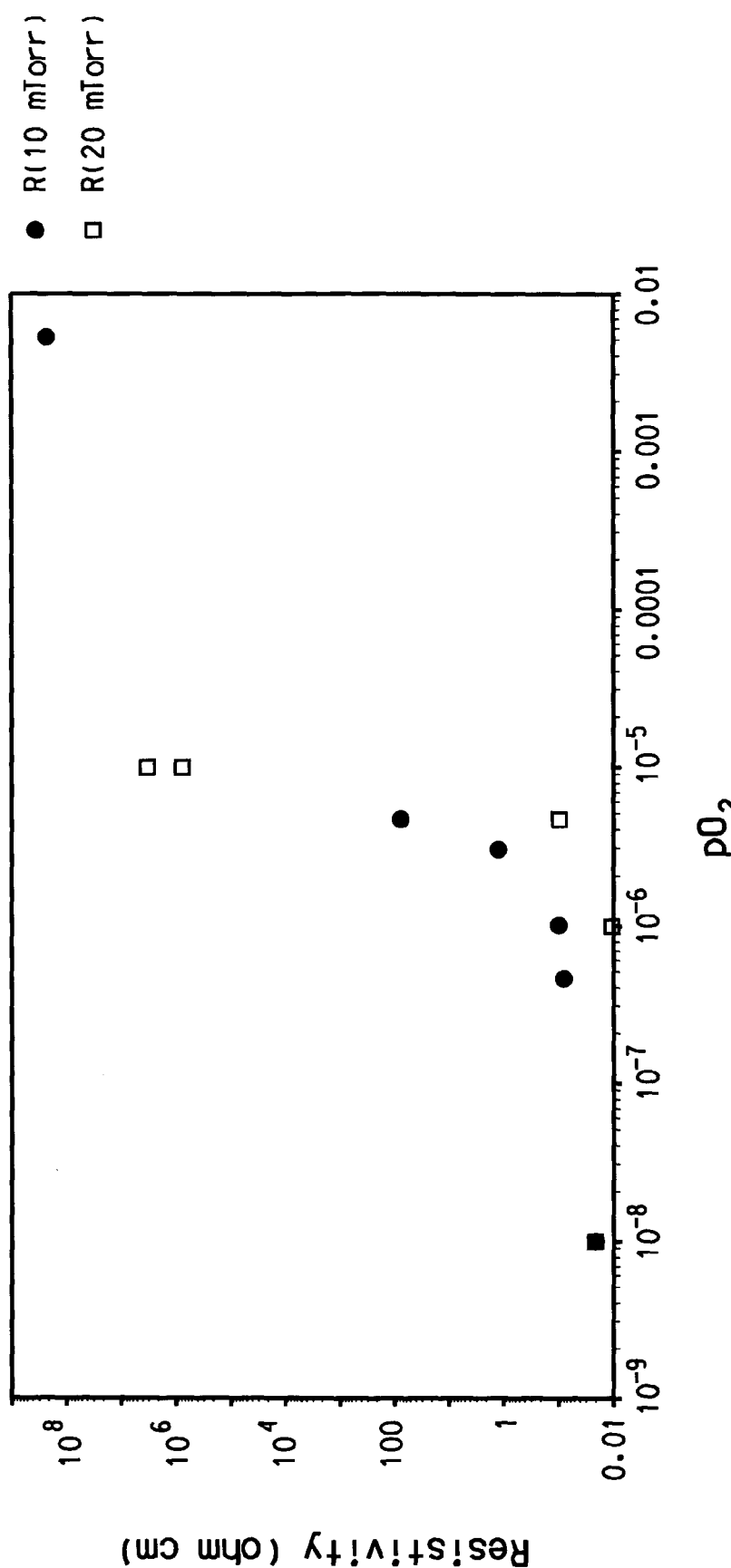
FIG. 1 shows the dependence of resistivity on $pO_2$ for ZnO films rf magnetron sputtered in 10 mTorr and 20 mTorr of argon and oxygen.

While most electronic devices are fabricated today on rigid substrates, such as single crystalline Si or glass, there is a growing interest in devices on plastic or flexible substrates, particularly because they would be more mechanically robust, lighter weight, and potentially cheaper to manufacture by roll-to-roll processing. However, plastic substrates, such as polyethylene terephthalate (e.g., Mylar®, E. I. DuPont de Nemours Inc., and Wilmington, Del.) limit device processing to below 100 C. One consequence is that electronics based on Si, even amorphous Si, is incompatible with temperature-sensitive plastic substrates. This has fueled a broad interest in organic semiconductors as a low temperature class of alternative materials. However, most organic semiconductors generally have inferior electronic properties, compared to amorphous Si, for device application. Further, organic materials commonly degrade in normal atmospheric conditions, requiring protection strategies. In contrast a stable inorganic semiconductor with processing compatible with temperature-sensitive substrates, and electronic properties equivalent to amorphous Si would enable electronics for a variety of flexible substrates. For this application thin film transistors based on novel sputtered transparent oxide semiconductors can be made with excellent electronic properties on flexible substrates. The TOS is also transparent in the visible part of the electromagnetic spectrum. This may be of particular advantage (1) in electronic display applications.

As an example, magnetron sputtering is used to form the ZnO semiconductor layer. Using a unique range of deposition conditions, with no intentional substrate heating (compatible with low temperature plastic substrates), novel ZnO layers were made that were polycrystalline (X-ray diffraction) with good electron transport properties. The ZnO layers are suitable for application as semiconductors in TFTs.

The good transport characteristics of the ZnO semiconductor of this invention, and prototypical of these TOS, include high electrical resistivity, for low device 'off' current combined with high charge carrier mobility for high 'on' device current. In the sputtered ZnO thin films of the present invention, the electrical resistivity is controlled by metering the partial pressure of oxygen during deposition. A novel aspect of our preparation of ZnO was the discovery that sputtering conditions favorable for achieving low ZnO film stress were also favorable for high transconductance and high on/off current ratio in ZnO TFT devices made at room temperature. It is believed the reason is that low stress ZnO films have fewer defects and a favorable electronic structure, which promote higher charge carrier mobility. Consequently, the ZnO films of the present invention exhibit better TFT device performance.

In one embodiment of this invention, the source, drain, and gate electrodes are resistance evaporated Al about 100 nm thick. The ZnO semiconductor is about 100 nm thick layer made by rf magnetron sputtering in a mixture of Ar and $O_2$ gases. The gate insulator is $Al_2O_3$, e-beam vapor-deposited with thickness between 100 nm and 300 nm. The substrates are polyethylene terephthalate (PET and Kapton® polyimide, E. I. DuPont de Nemours Inc., Wilmington, Del.). All depositions were carried out, while maintaining the substrate at or near room temperature.

A thin film transistor (TFT) is an active device, which is the building block for electronic circuits that switch and amplify electronic signals. Attractive TFT device characteristics include a low voltage to turn it on, a high transconductance or device current/(gate) control voltage ratio, and a high 'on' ($V_g>0$) current to 'off' ($V_g \leq 0$) current ratio. In a typical TFT structure of this invention, the substrate is paper or polymer, such as PET, PEN, Kapton, etc. Source and drain conducting electrodes are patterned on the substrate. The TOS is then deposited, followed by a gate insulating layer such as $SiO_2$ or $Al_2O_3$. Finally, a gate conducting electrode is deposited on the gate insulating layer. One of skill in the art will recognize, this is one of many possible TFT fabrication schemes. In the operation of this device, a voltage applied between the source and drain electrodes establishes a substantial current flow only when the control gate electrode is energized. That is, the flow of current between the source and drain electrodes is modulated or controlled by the bias voltage applied to the gate electrode. The relationship between material and device parameters of the TOS TFT can be expressed by the approximate equation, $$I_{sd} = (W/2L)C\mu(V_g)^2$$

where $I_{sd}$ is the saturation source-drain current, C is the geometric gate capacitance, associated with the insulating layer, W and L are physical device dimensions, $\mu$ is the carrier (hole or electron) mobility in the TOS, and $V_g$ is the applied gate voltage. Ideally, the TFT passes current only when a gate voltage of appropriate polarity is applied. However, with zero gate voltage the "off" current between source and drain will depend on the intrinsic conductivity, $$\sigma = nq\mu$$

of the TOS, where n is the charge carrier density, and q is the charge, so that $$(I_{sd}) = \sigma(Wt/L)V_{sd} @ V_g=0$$

Here t is the TOS layer thickness and $V_{sd}$ is the voltage applied between source and drain. Therefore, for the TFT to operate as a good electronic switch, e.g. in a display, with a high on/off current ratio, the TCOS semiconductor needs to have high carrier mobility but very small intrinsic conductivity, or equivalently, a low charge carrier density. On/off ratios $>10^3$ are desirable for practical devices.

Figure 2:
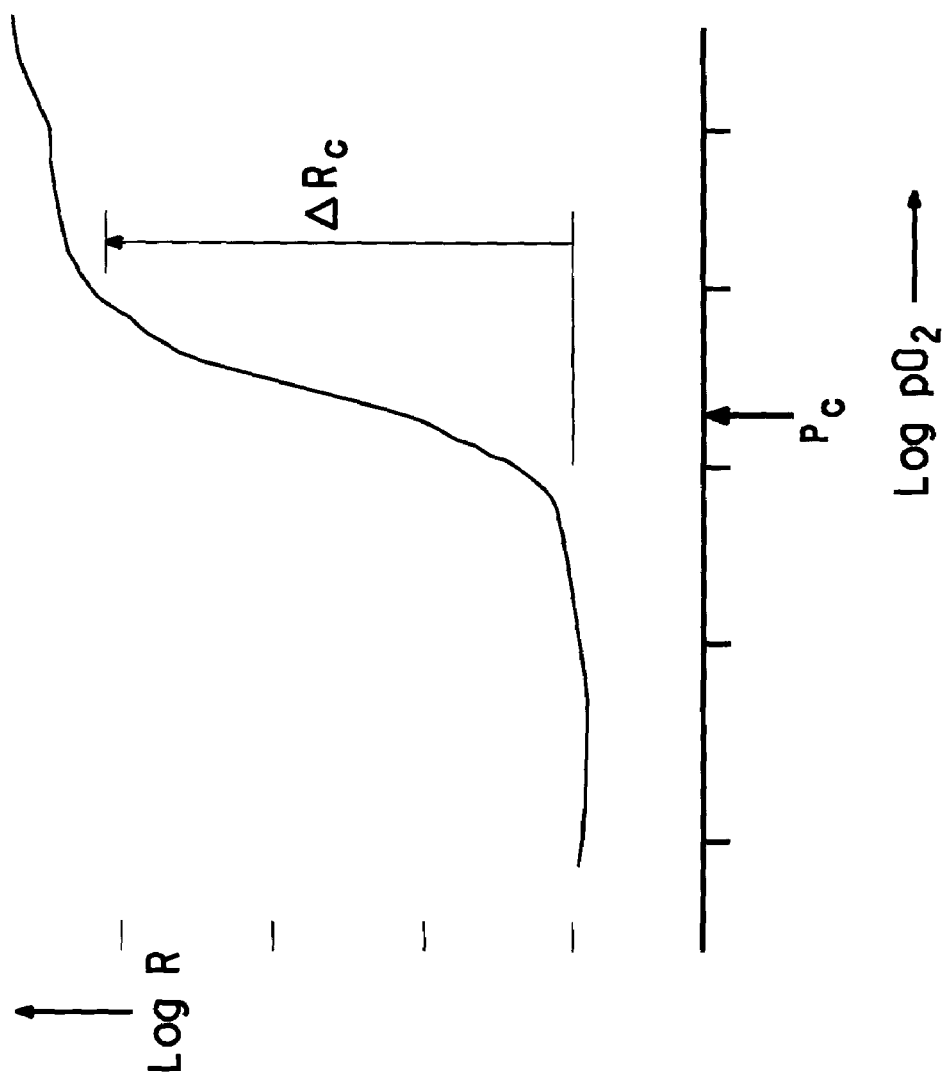
FIG. 2 shows the general resistance characteristic as a function of the partial pressure of the oxygen source for ZnO films made by PVD or CVD methods.

Specifically, when undoped ZnO thin films are dc or rf magnetron sputtered from a Zn or ZnO target in a partial pressure of oxygen, $pO_2$, the bulk resistivity (R) changes abruptly from strongly semi-conducting ($R \sim 10^{-2}$ ohm cm), to nearly insulating ($R \sim 10^6 - 10^8$ ohm cm), with increasing $pO_2$. This dependence of R on $pO_2$ for ZnO films rf magnetron sputtered from an undoped ZnO target is shown in FIG. 1. (The dependence of R on $pO_2$ will be similar for indium oxide, tin oxide, and cadmium oxide thin films). The sputtering system consisted of a cryo-pumped stainless steel vacuum chamber (about 25 inch diameter×15 inch high) with a water-cooled stationary table for substrates. The target diameter was 6.5 inches, the substrate-to-target distance was about 3 inches, and rf (13.56 MHz) power was coupled to the target through a standard impedance matching network. The vendor analysis of the target indicated it contained impurities of As, Fe, Cd, Cu, Ca, Mn, Na, Pb in amounts <20 ppm. For the ZnO films whose resistivities are given in FIG. 1, there is a critical oxygen partial pressure, $P_c$, for which the change in resistivity, $\Delta R_c$ in the vicinity of $P_c$ is very large and abrupt. $P_c$ is defined as the oxygen partial pressure corresponding to the mid point of the abrupt rise in resistivity. Specifically, $\Delta R_c$ increased by $>10^4$ ohm cm for $pO_2$ between $P_c/2$ and $2P_c$. For FIG. 1, the critical pressure, $P_c$ is approximately $10^{-5}$ Torr. This characteristic of an abrupt, large change in R versus $pO_2$, occurring at a critical oxygen partial pressure $P_c$ is a general result, as sketched in FIG. 2, for ZnO films and other TOS films prepared by any vapor deposition method, chemical or physical, that requires a source of oxygen for the synthesis. Physical vapor deposition (PVD) principally involves all forms of sputtering (rf, dc, magnetron, diode, triode, ion-beam) and evaporation (resistive, laser, electron beam). Commonly PVD of TOS relies on a solid or molten source of the corresponding metal or metal oxide. Chemical vapor deposition (CVD) requires chemical vapor transport and chemical reaction for film formation. Reactants are commonly gaseous, and examples of reaction types include pyrolysis, reduction, oxidation, disproportionation, and compound formation. CVD processes include low-pressure (LPCVD), plasma-enhanced (PECVD), atomic layer chemical vapor deposition (AL-CVD, also known as atomic layer deposition, ALD), and laser-enhanced (LECVD) methods.

Independent of preparation method, $P_c$ defines oxide growth conditions, for which the arrival rate of atomic oxygen just matches the arrival rate of atomic Zn, In, Sn, or Cd to form the stoichiometric oxide, e.g. ZnO, with semi-insulating resistivity, i.e. ~$10^8$ ohm cm. Consequently, only a small deviation from stoichiometry e.g., $Zn_{1.0001}O_{1.0000}$, will reduce the resistivity by orders of magnitude, since 0.01% excess Zn corresponds to ~$10^{19}$ free electrons (two electrons per interstitial Zn ion) or a resistivity ~1 ohm cm for $\mu$~1 $cm^2$/V-s. Therefore, in the vicinity of $P_c$, only a very small change in $pO_2$ will cause a large, abrupt change in resistivity, independent of the preparation method.

However, the actual value of $P_c$ will depend on specific deposition conditions and the specific oxide as well as the physical and dynamic characteristics of the deposition system. Also, the actual magnitude of the resistance change, $\Delta R_c$ in the vicinity of $P_c$, will depend on the level of impurities (dopants) incorporated into the oxide film. A lower impurity level will increase the magnitude of $\Delta R_c$, whereas a higher concentration of impurities will reduce it. But the general resistance characteristic will be system invariant, so that one skilled in the art of vapor deposition can find $P_c$ for that particular system used to make undoped TOS films.

The field effect transistors of the present invention based on a nominally undoped TOS must be deposited under an effective partial pressure of oxygen using physical vapor deposition or chemical vapor deposition, preferably rf magnetron sputtering. An effective partial pressure of oxygen is a range of oxygen partial pressure about the critical partial pressure such that the electrical resistivity is intermediate between a low, nearly-conductive value observed for very low oxygen partial pressures and a high, nearly-insulating value value observed for high oxygen partial pressures. The best performance (high channel current and high device on/off ratio) occurs when a TOS is made by vapor deposition in the preferable range of oxygen partial pressure, 0.1 $P_c$<$pO_2$<10 $P_c$, and more preferably in the range, 0.5 $P_c$<$pO_2$<2 $P_c$. The following examples of magnetron sputtered ZnO thin film transistors and an $In_2O_3$ TFT illustrate this effect. Conditions for ZnO preparation with $pO_2$ in the range 0.1 $P_c$<$pO_2$<10 $P_c$, where $P_c$≈$10^{-5}$ Torr were chosen for sputtering in Examples 1–3. Examples 4 and 5 illustrate that sputtering outside the preferred $pO_2$ produces TFTs with inferior properties. Example 6 illustrates the structure and properties of a ZnO TFT fabricated on a flexible substrate. Example 7 illustrates properties of a ZnO TFT comprised of conducting ZnO source, drain, and gate electrodes, semi-conducting ZnO channel, and a ZnO dielectric. Example 8 describes properties of an indium oxide TFT made near the critical oxygen partial pressure.

The general structure of the ZnO and $In_2O_3$ field effect transistor of these examples is shown in FIG. 3. TFTs were fabricated on heavily doped n-type Si substrates with a thermal oxide layer about 100 nm thick on one side. Ti—Au source and drain electrodes (10 nm Ti followed by 100 nm Au), 200 μm wide with a 20 μm gap were deposited and patterned directly on the thermal silicon oxide layer by traditional photolithography. Ti—Au was also deposited on the back-side of the Si as a common gate electrode, and ZnO or $In_2O_3$ about 100 nm thick was then sputtered between source and drain electrodes using a shadow mask.

The TFT structure described herein includes a transparent oxide semiconductor with conducting electrodes, commonly referred to as a source and a drain, for injecting a current into the oxide semiconductor and a capacitance charge injection scheme for controlling and/or modulating the source-drain current. The semiconductor deposition process uses magnetron sputtering of an oxide or metal target in an atmosphere with a controlled partial pressure of oxygen in an inert gas. This is a low temperature process which is compatible with temperature sensitive substrates and components. One particularly attractive application of TOS TFT's is in the drive circuits for displays on flexible, polymer substrates. TOS transistors and/or transistor arrays are useful in applications including, but not limited to, flat panel displays, active matrix imagers, sensors, rf price labels, electronic paper systems, rf identification tags and rf inventory tags.

The TFT structure described herein is applicable to flexible substrates. The flexible substrate may be a polymer film such as, but not limited to, polyethylene terephthalate (PET), polyethylene naphthalate (PEN), polyethersulphone (PES) and polycarbonate (PC). Flexible substrates can also be thin metal foils such as stainless steel provided they are coated with an insulating layer to electrically isolate the thin film transistor.

By control of the oxygen partial pressure during deposition, it is possible to control the electrical conductivity of the undoped metal oxide such that the metal oxide can be an insulator, semiconductor or conductor. Thus by varying the oxygen partial pressure, all elements of a thin film transistor, semiconductor, conductors (source, drain and gate) and insulators (gate dielectric) can be made from the same oxide material but deposited under different conditions.

EXAMPLES

Example 1

Figure 4:
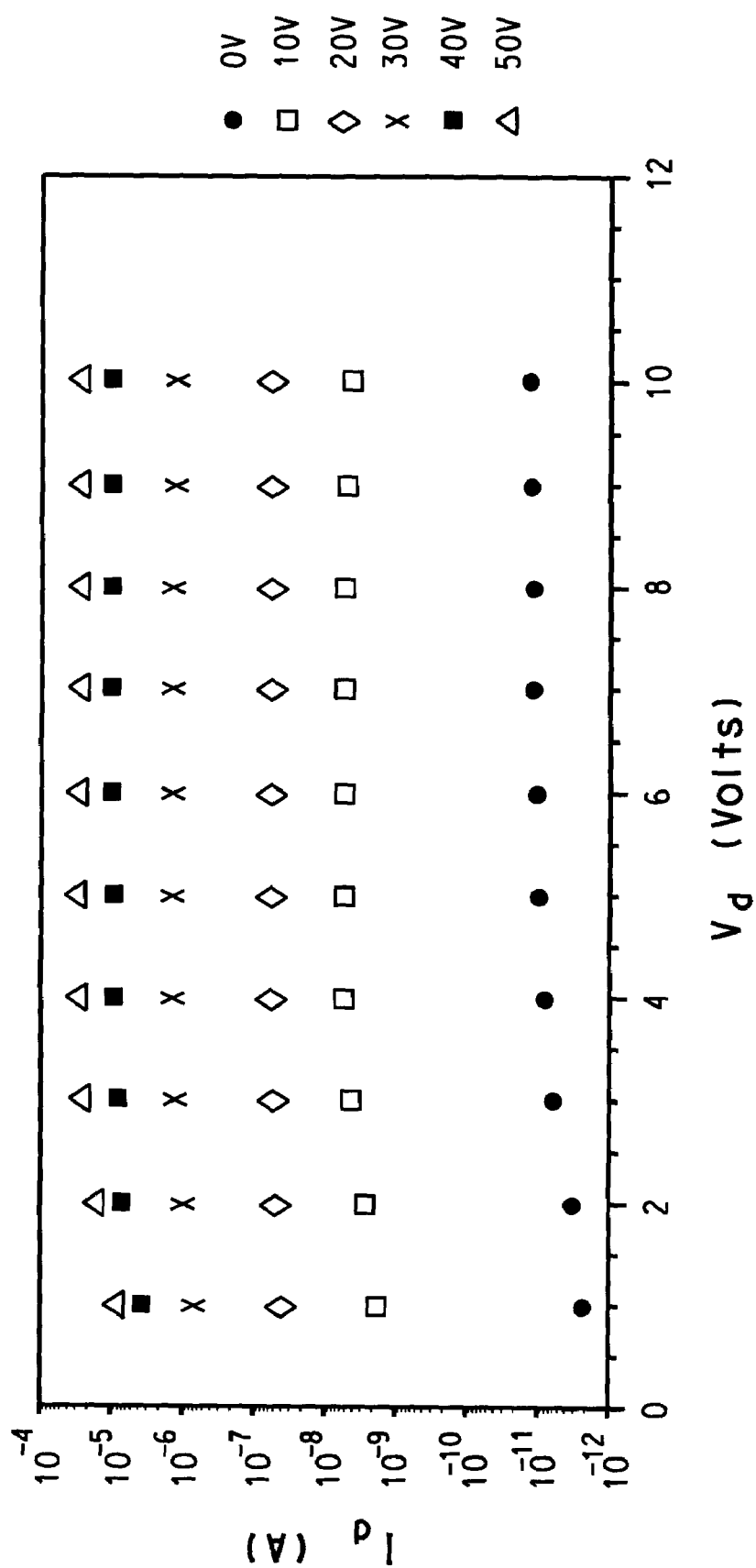
FIG. 4 shows a ZnO TFT I-V curve for rf (radio frequency) magnetron sputtered films made with $pO_2=P_c$

Using the transistor configuration shown in FIG. 3, a ZnO thin film semiconductor was rf magnetron sputtered at room temperature to deposit between source and drain electrodes, using a shadow mask. The ZnO target was 6.5 inch diameter and the rf power for sputtering was 100 W. The total gas pressure during sputtering was 20 mTorr, comprised of $1 \times 10^{-5}$ Torr of oxygen, or $pO_2$=$P_c$, with the balance being argon. The ZnO film thickness, determined optically, was 849 A for a sputtering time of 500 sec. FIG. 4 is a set of corresponding drain current ($I_d$) versus drain voltage ($V_d$) transistor curves for gate voltages ($V_g$) between zero and 50 V. For this device, the field effect mobility ($\mu_{FE}$) from the linear current-voltage characteristics was determined to be 1.2 $cm^2$/V-s with an on/off ratio equal to $1.6 \times 10^6$. This on/off ratio corresponds to the ratio of source-drain current with 50 V and 0 V bias on the gate electrode while applying 10V between source and drain electrodes.

Example 2

Figure 5:
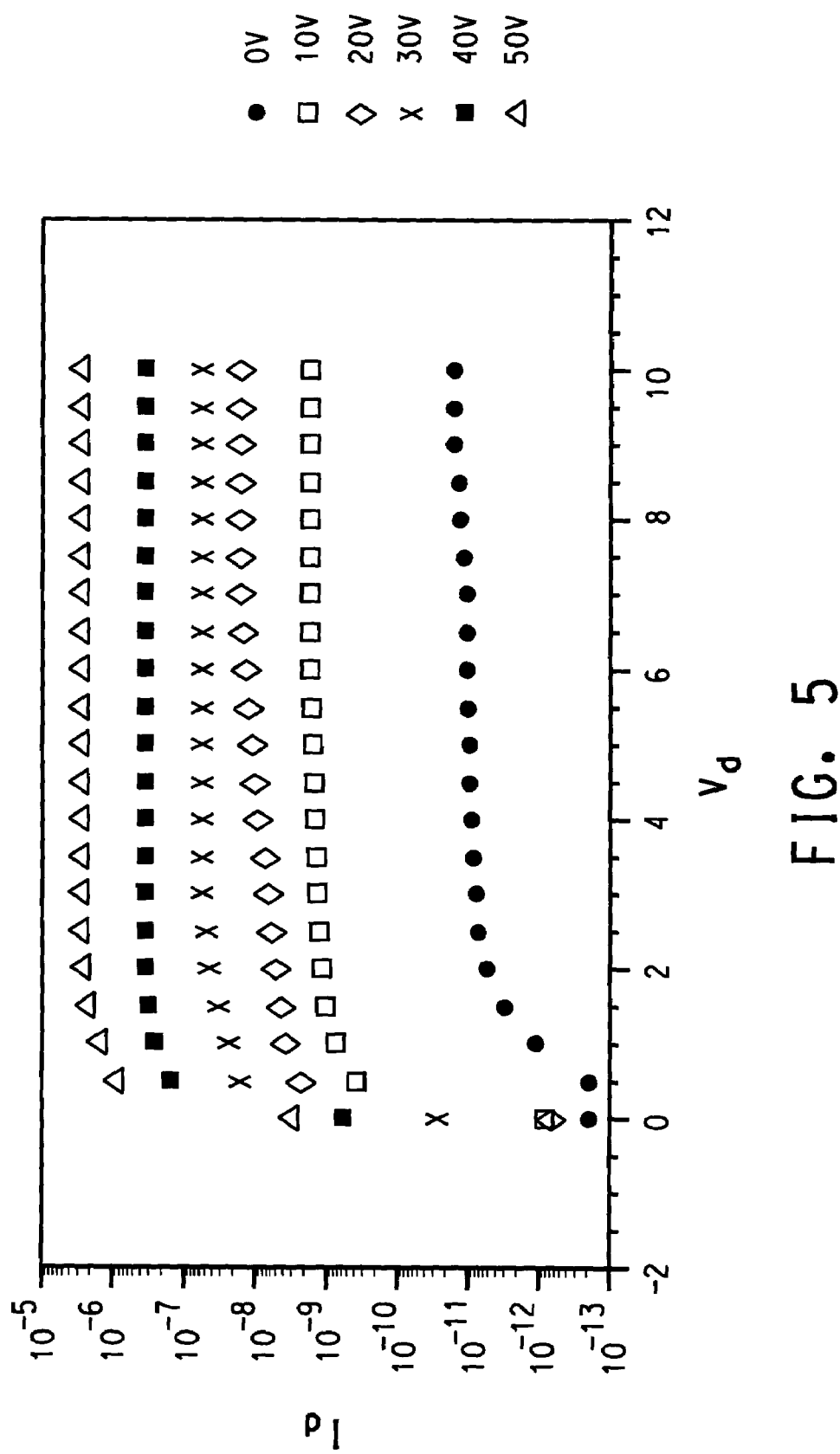
FIG. 5 shows a ZnO TFT I-V curve for rf magnetron sputtered films made with $pO_2=2P_c$

Using the transistor configuration shown in FIG. 3, a ZnO thin film semiconductor was rf magnetron sputtered at room temperature to deposit between source and drain electrodes, using a shadow mask. The ZnO target was 6.5 inch diameter and the rf power for sputtering was 100 W. The total gas pressure during sputtering was 20 mTorr, comprised of $2 \times 10^{-5}$ Torr of oxygen, or $pO_2$=$2P_c$, with the balance being argon. The ZnO film thickness, determined optically, was 677 Å for a sputtering time of 500 sec. FIG. 5 is a set of corresponding drain current (Id) versus drain voltage (Vd) transistor curves for gate voltages (Vg) between zero and 50 V. For this device, the field effect mobility ($\mu_{FE}$) from the linear current-voltage characteristics was determined to be 0.3 cm$^2$/V-s with an on/off ratio equal to $1.0 \times 10^5$.

Example 3

Figure 6:
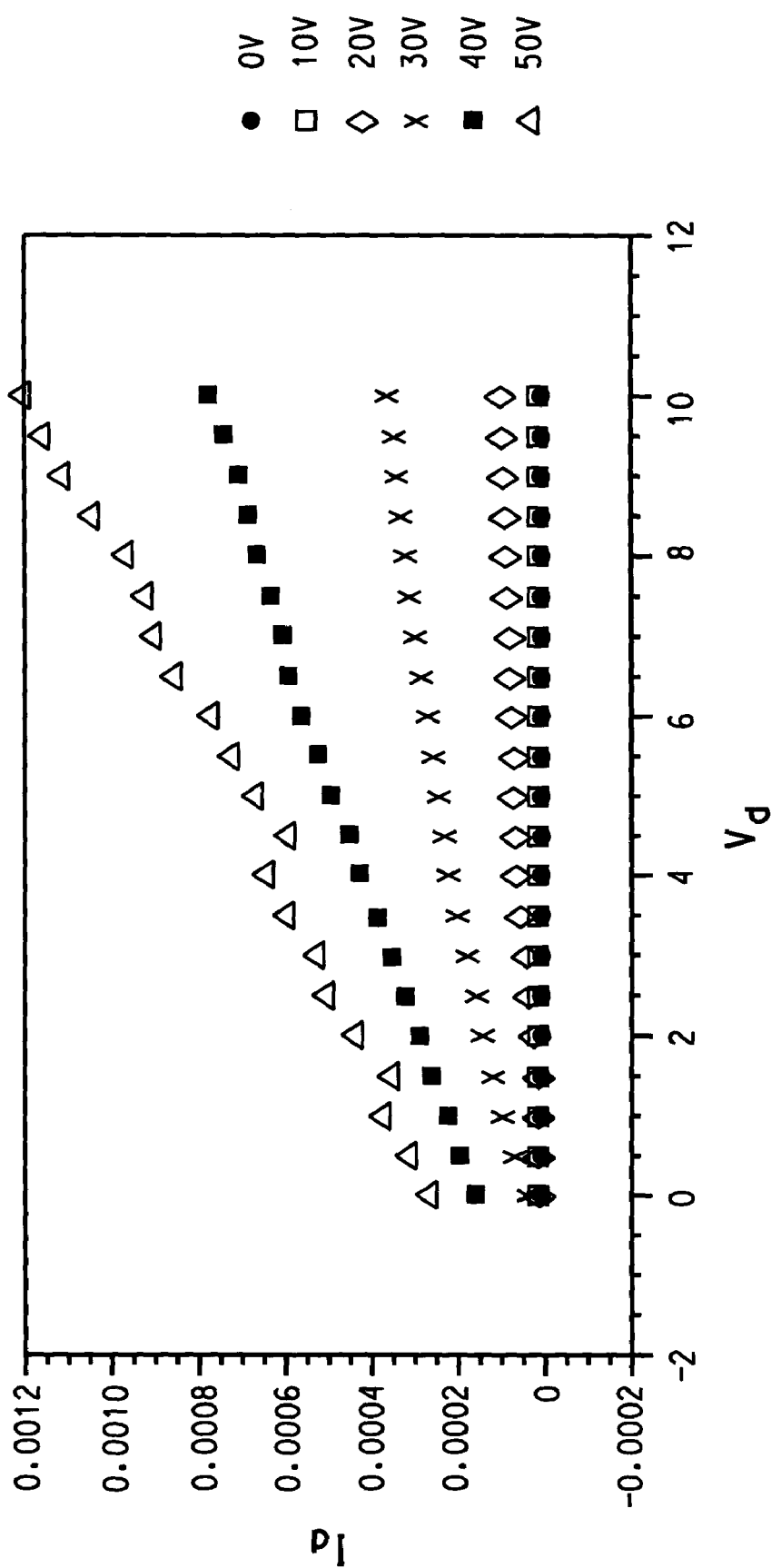
FIG. 6 shows a ZnO TFT I-V curve for rf magnetron sputtered films made with $pO_2=0.75P_c$

Using the transistor configuration shown in FIG. 3, a ZnO thin film semiconductor was rf magnetron sputtered at room temperature to deposit between source and drain electrodes, using a shadow mask. The ZnO target was 6.5 inch diameter and the rf power for sputtering was 100 W. The total gas pressure during sputtering was 20 mTorr, comprised of $0.75 \times 10^{-5}$ Torr of oxygen, or pO$_2$=0.75 P$_c$, with the balance being argon. The ZnO film thickness, determined optically, was 897 Å for a sputtering time of 500 sec. FIG. 6 is a set of corresponding drain current (I$_d$) versus drain voltage (V$_d$) transistor curves for gate voltages (V$_g$) between zero and 50 V. For this device, the field effect mobility ($\mu_{FE}$) from the saturation current-voltage characteristics was determined to be 6.8 cm$^2$/V-s with an on/off ratio equal to $1 \times 10^3$.

Example 4

Figure 7:
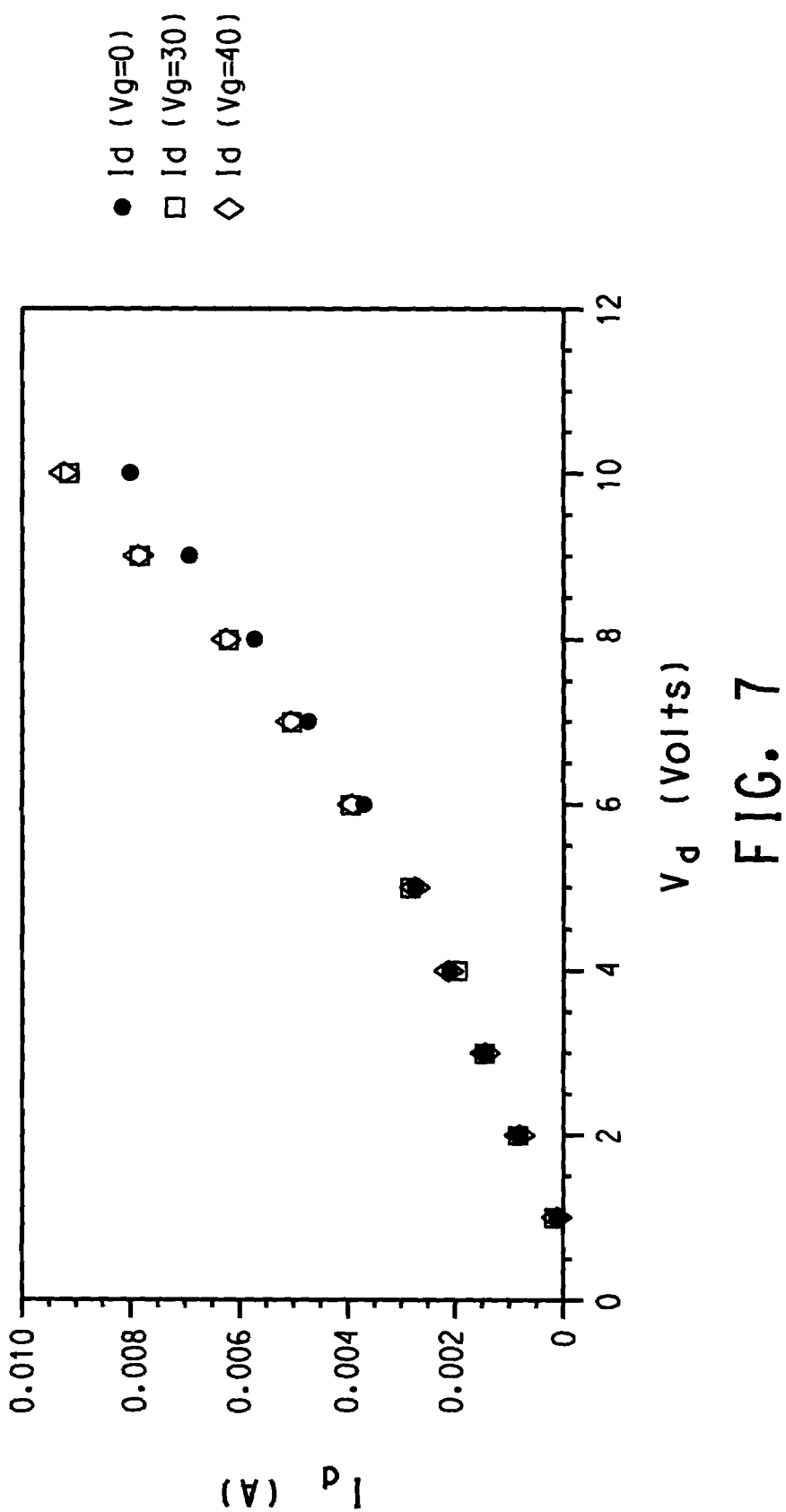
FIG. 7 shows a ZnO TFT I-V curve for rf magnetron sputtered films made with $pO_2=0.08P_c$

Using the transistor configuration shown in FIG. 3, a ZnO thin film semiconductor was rf magnetron sputtered at room temperature to deposit between source and drain electrodes, using a shadow mask. The ZnO target was 6.5 inch diameter and the rf power for sputtering was 100 W. The total gas pressure during sputtering was 20 mTorr, comprised of $0.8 \times 10^{-6}$ Torr of oxygen, or pO$_2$=0.08 P$_c$, with the balance being argon. The value pO$_2$=0.08 P$_c$ is outside our preferred range of oxygen partial pressure. The ZnO film thickness, determined optically, was 1071 Å for a sputtering time of 465 sec. FIG. 7 shows a set of the corresponding drain current (Id) versus drain voltage (Vd) curves for gate voltages (Vg) of zero, 30 V and 40 V. This device does not have the performance characteristics of a transistor. There is negligibly small modulation of the current by application of a gate voltage and the ratio of the device current with no gate and either 30 or 40 V gate is unacceptably close to one. The device acts more like a resistor.

Example 5

Figure 8:
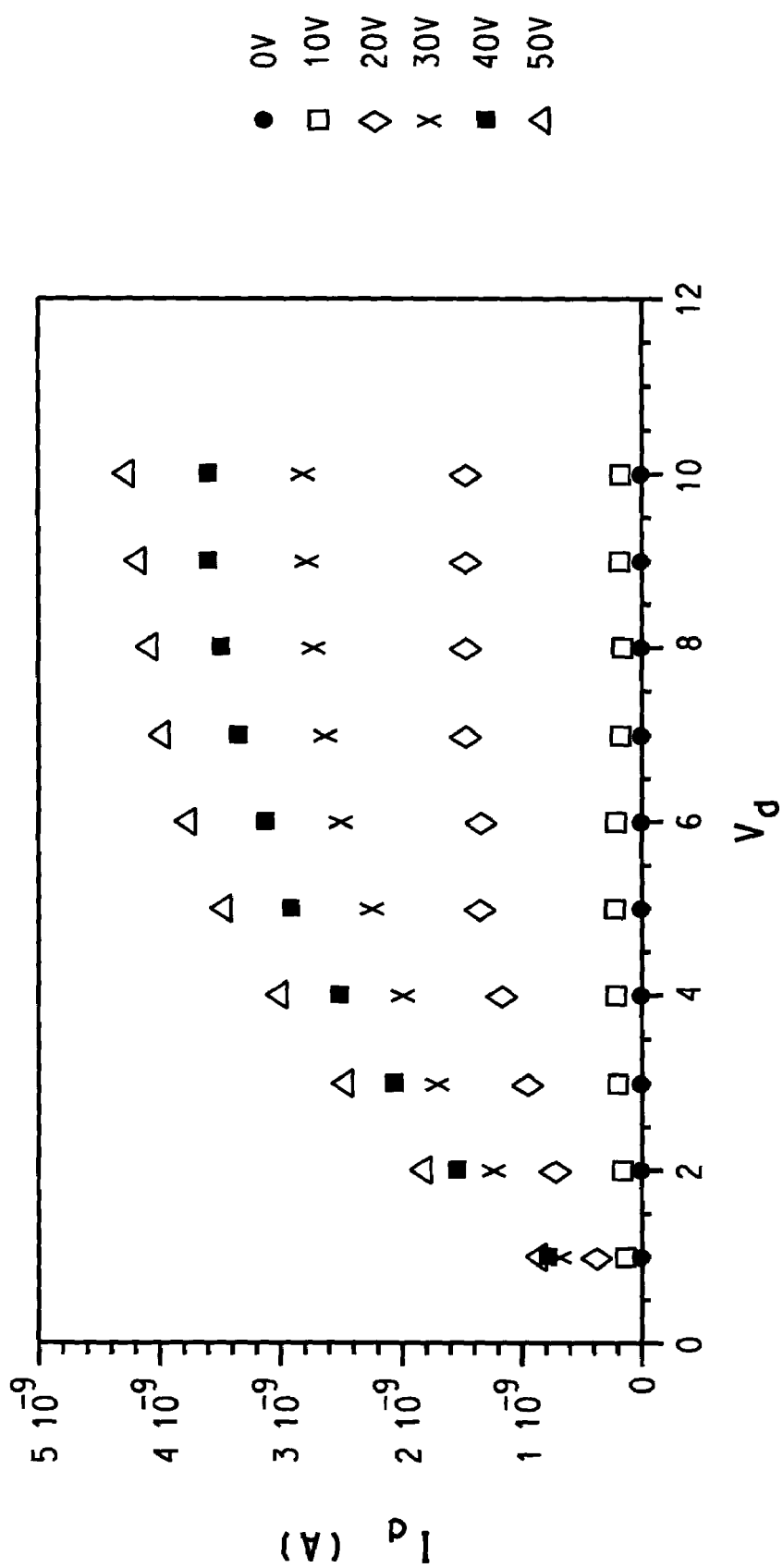
FIG. 8 shows a ZnO TFT I-V curve for rf magnetron sputtered films made with $pO_2=20P_c$ FIGS. 9(a) and (b) show a I-V curve for ZnO TFT fabricated on a flexible substrate.

Using the transistor configuration shown in FIG. 3, a ZnO thin film semiconductor was rf magnetron sputtered at room temperature to deposit between source and drain electrodes, using a shadow mask. The ZnO target was 6.5 inch diameter and the rf power for sputtering was 100 W. The total gas pressure during sputtering was 20 mTorr, comprised of $2 \times 10^{-4}$ Torr of oxygen, or pO$_2$=20 P$_c$, with the balance being argon. The value pO$_2$=20 P$_c$ is outside our preferred range of oxygen partial pressure. The ZnO film thickness, determined optically, was 1080 Å for a sputtering time of 465 sec. FIG. 8 shows a set of the corresponding drain current (Id) versus drain voltage (Vd) curves for gate voltages (Vg) of zero to 50 V. The device I-V curve is characteristic of a thin film transistor, however the drain current is quite small. For this device, the field effect mobility ($\mu_{FE}$) from the linear current-voltage characteristics was determined to be $5 \times 10^{-5}$ cm$^2$/V-s with an on/off ratio equal to about 700. Both the mobility and the on/off ratio are much smaller than for TFT devices made within the preferred range of pO$_2$.

Example 6

Figure 9A:
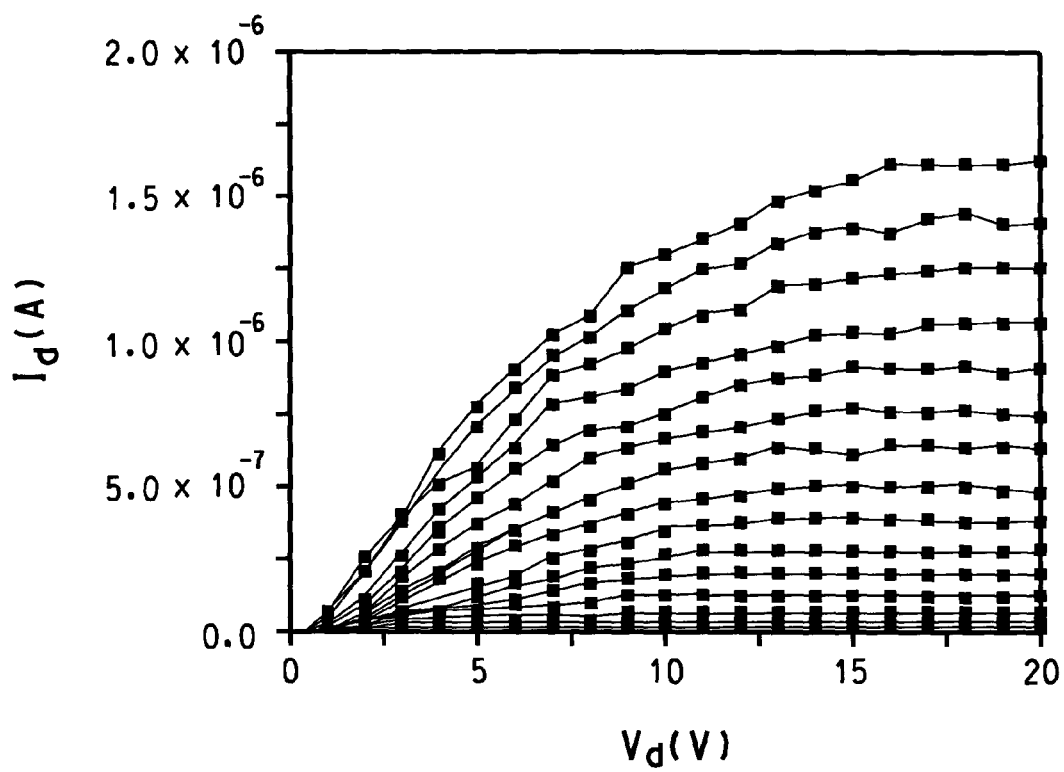
FIG. 9(a) shows a curve of Id versus Vd varying the gate voltage from 0V to 20V in steps of 1V.
Figure 9B:
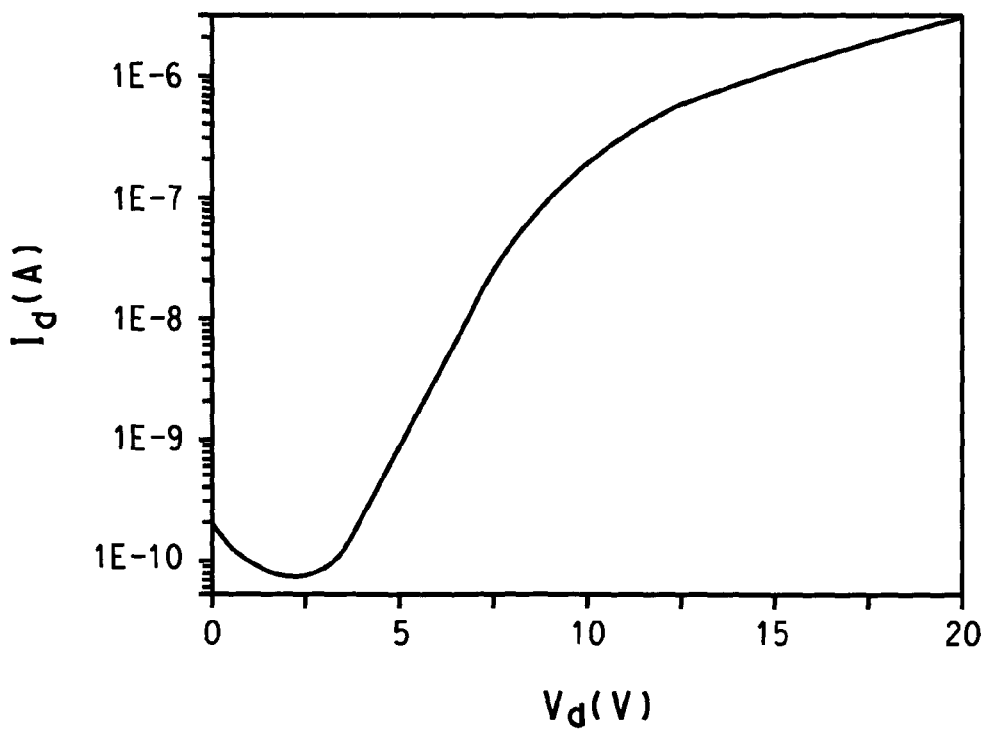
FIG. 9(b) shows Id versus gate coltage as Vd=20V. In this transistor, W=400 μm and L=40 μm.

As an example of a ZnO TFT on a flexible substrate, transistors were fabricated on DuPont Pyralux® (Cu-coated) polyimide. Cu source and drain were lithographically patterned using DuPont Riston® uv-imaged through a phototool, followed by sputtering 100 nm thick ZnO semiconductor. (The ZnO sputtering conditions were identical to those in Example 1). A fluoropolymer dielectric (relative dielectric constant, $\epsilon$=8.7) was then laminated at 120° C. over the semiconductor active region, and Al gates were thermally evaporated using a shadow mask. FIGS. 9(a) and (b) shows the performance of these flexible transistors, which have $\mu$~0.4 cm$^2$/V-s and on/off ratios larger than $10^4$.

Example 7

Figure 10:
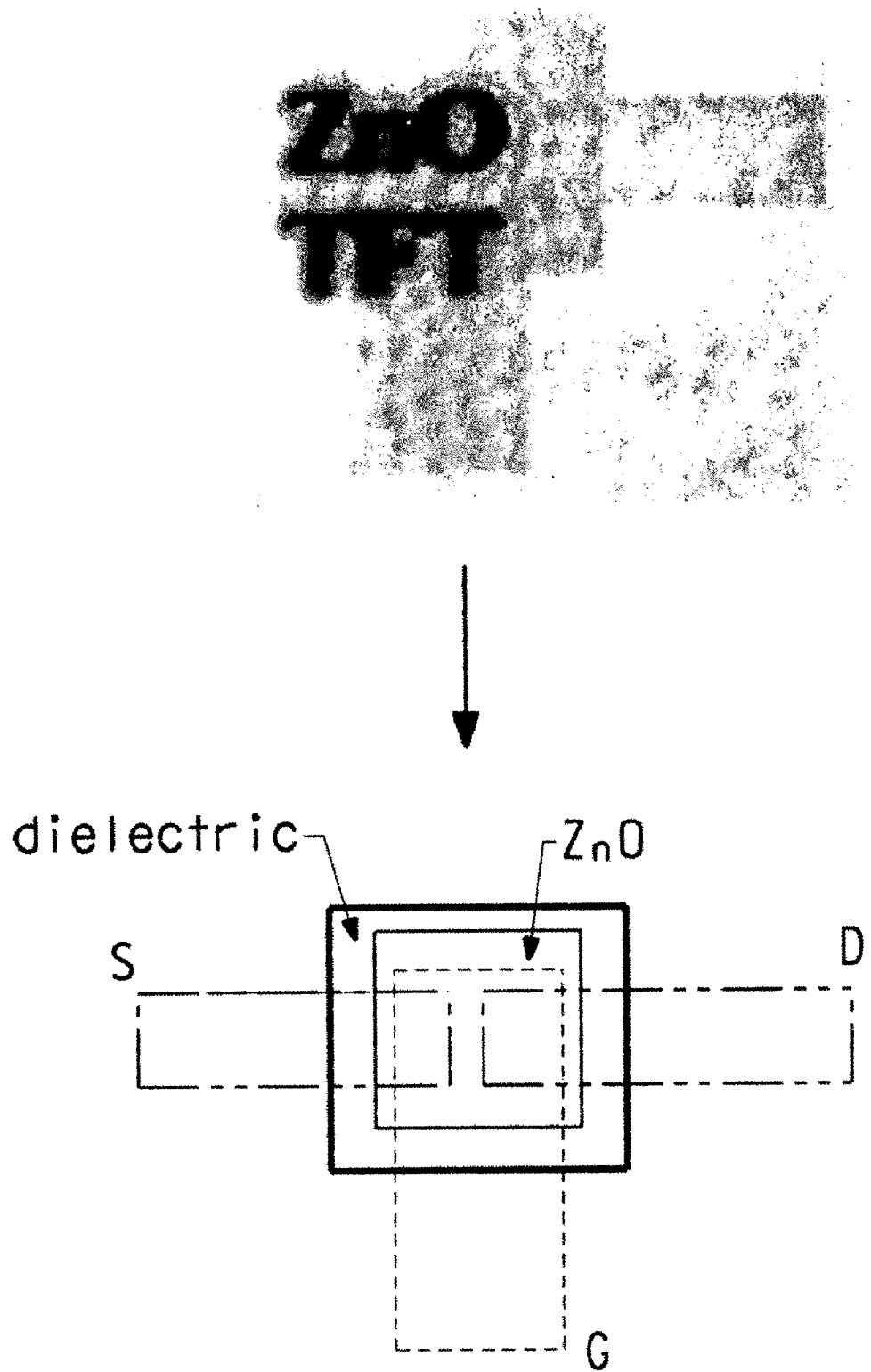
FIG. 10 shows optical images of a TFT comprised of only ZnO.
Figure 11:
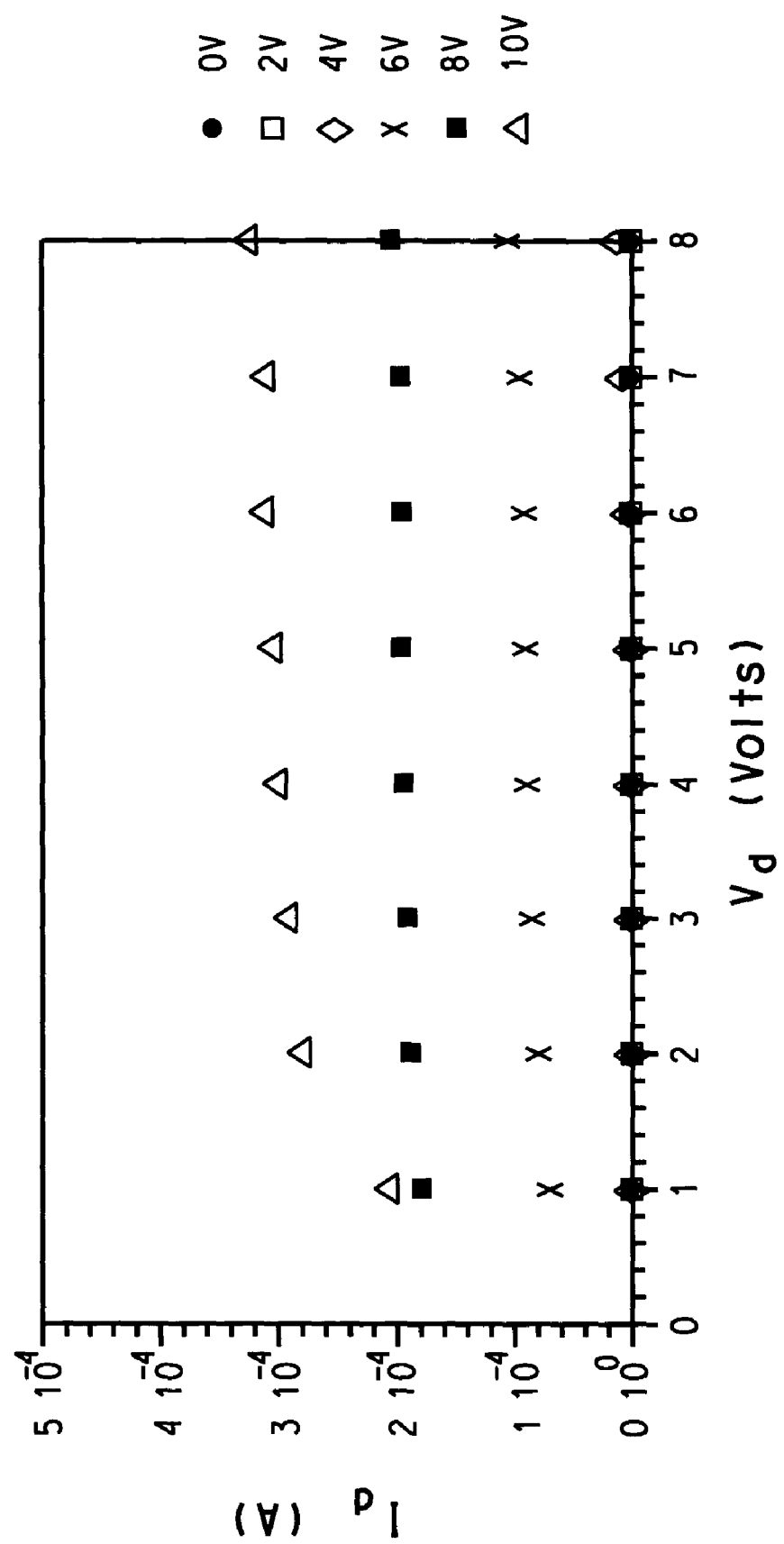
FIG. 11 shows I-V curve for a TFT comprised of only ZnO.

By tailoring the resistivity of ZnO films from semiconducting to semi-insulating, as shown in FIG. 1, a transparent thin film transistor was fabricated using only ZnO. The substrates were glass and polyethylene terephthalate (PET). Source-drain electrodes of conducting ZnO were first grown by sputtering at 100 W from a ZnO target in 10 mTorr of Ar without oxygen. The semiconducting channel layer, 100 nm thick, was then sputtered at 20 mTorr Ar and $1 \times 10^{-5}$ Torr of O$_2$. The next layer was a semi-insulating ZnO for the gate dielectric, 500 nm thick, made by sputtering a ZnO target in a 50% mixture of Ar+O$_2$ at a total pressure of 10 mTorr. Finally the ZnO gate electrode was sputtered at the same conditions used for the source-drain electrodes. As shown in FIG. 10, this structure is optically transparent, allowing easy reading of the caption, "ZnO TFT" beneath the transistor. The current-voltage characteristic in FIG. 11 illustrates that the source-drain current can be modulated by an application of a gate voltage.

Example 8

Figure 12:
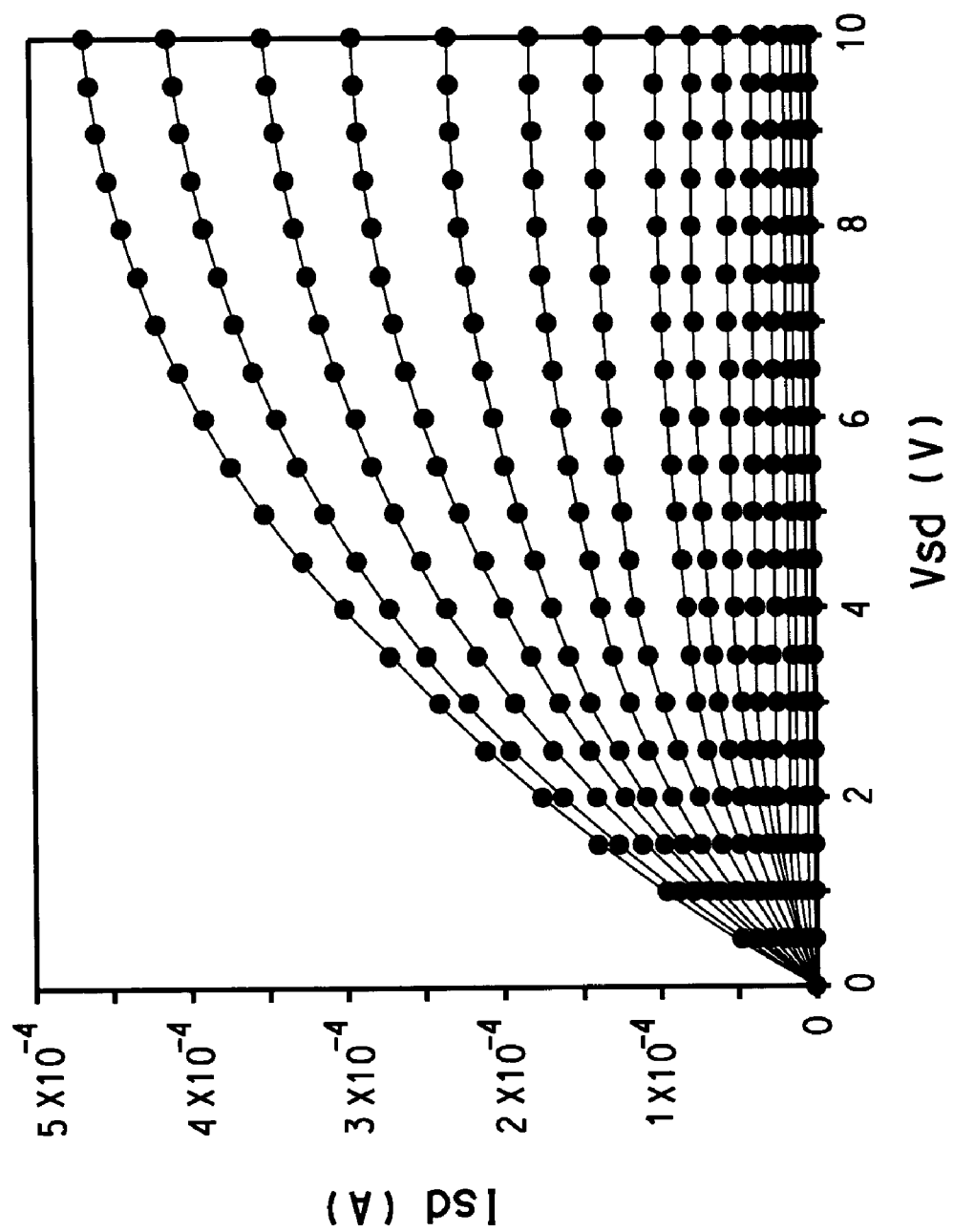
FIG. 12 shows I-V curve for a indium oxide TFT fabricated with $pO_2$ near $P_c$.

Using the transistor configuration shown in FIG. 3, an indium oxide thin film semiconductor was rf magnetron sputtered at room temperature to deposit between source and drain electrodes, using a shadow mask. The indium oxide target was 6.5 inch diameter and the rf power for sputtering was 100 W. The total gas pressure during sputtering was 12 mTorr, comprised of 2 mTorr of oxygen, or pO$_2$ close to P$_c$, with the balance of 10 mTorr argon. The indium oxide film thickness, determined optically, was 1285 Å for a sputtering time of about 33 min. FIG. 12 is a set of corresponding drain current (I$_d$) versus drain voltage (V$_d$) transistor curves for gate voltages (V$_g$) between −20 V and 10 V. For this device, the field effect mobility ($\mu_{FE}$) from the linear current-voltage characteristics was determined to be 17 cm$^2$/V-s with an on/off ratio equal to about $2 \times 10^2$. This on/off ratio can likely be improved by use of a higher gate voltage and optimization of sputtering conditions.

Example 9

This example illustrates low voltage and high current operation in a ZnO TFT on an aluminum oxide gate dielectric. The substrate, which also served as the gate electrode, was a heavily doped (with Phosphorous), n-type silicon wafer, 1-inch×1-inch×475 microns thick. One side of this wafer was coated with an aluminum oxide gate dielectric layer by electron-beam evaporation from a high purity, solid aluminum-oxide source. The measured aluminum oxide film thickness was 4483 Å. Aluminum-metal source and drain electrodes, about 1500 Å thick, were thermally evaporated on the oxide dielectric through a shadow mask to create a transistor channel length 80 microns by about 800 microns wide. A shadow mask was then used to magnetron sputter ZnO semiconductor, 918 Å thick, in the channel between source and drain electrodes. Sputtering was in 20 mTorr Ar and $1\times10^{-5}$ Torr $O_2$. FIG. 13 is a set of transistor current ($I_d$) versus drain voltage ($V_d$) curves for gate voltages between zero and three (3) volts and $V_d$ between 0 and 3 V. For this device the field-effect mobility was determined to be ~3 $cm^2$/V-s with an on-off ratio >$10^3$. For three volt operation the current is substantial at >1 microampere.

The invention claimed is:

1. A transistor comprising a an undoped, transparent, metal oxide semiconductor electrically coupled between a source electrode and a drain electrode, and a gate electrode electrically coupled to said undoped transparent metal oxide semiconductor, such that the application of a bias to the gate electrode controls electric current flow in the undoped transparent metal oxide semiconductor between source and drain electrodes.

2. A flat panel display comprising one or an array of transparent oxide semiconductor transistors as recited in claim 1.

3. An active matrix imager comprising an array of transparent oxide semiconductor transistors as recited in claim 1.

4. A sensor comprising an array of transparent oxide semiconductor transistors as recited in claim 1.

5. A rf price label comprising an array of transparent oxide semiconductor transistors as recited in claim 1.

6. A rf identification tag comprising an array of transparent oxide semiconductor transistors as recited in claim 1.

7. A rf inventory tag comprising an array of transparent oxide semiconductor transistors as recited in claim 1.

8. The transistor of claim 1 deposited on a flexible substrate.

9. The transistor of claim 1 further comprising a gate electrode, and wherein said source, drain and gate electrodes are fabricated from a material selected from the group consisting of zinc oxide, indium oxide, tin oxide, and cadmium oxide.

10. The transistor of claim 8 further comprising a gate dielectric fabricated from a material selected from the group consisting of zinc oxide, indium oxide, tin oxide, and cadmium oxide.

11. The transistor of claim 1 wherein said updoped, transparent metal oxide semiconductor comprises at least one oxide selected from: zinc oxide, indium oxide, tin oxide, and cadmium oxide.

* * * * *